United States Patent
Hu et al.

(10) Patent No.: US 8,987,581 B2
(45) Date of Patent: Mar. 24, 2015

(54) SOLAR THERMOELECTRIC CELL WITH COVERING STRUCTURE TO PROVIDE THERMAL GRADIENT

(75) Inventors: Chun-Hua Hu, Beijing (CN); Chang-Hong Liu, Beijing (CN); Shou-Shan Fan, Beijing (CN)

(73) Assignees: Tsinghua University, Beijing (CN); Hon Hai Precision Industry Co., Ltd., New Taipei (TW)

( * ) Notice: Subject to any disclaimer, the term of this patent is extended or adjusted under 35 U.S.C. 154(b) by 894 days.

(21) Appl. No.: 12/876,357

(22) Filed: Sep. 7, 2010

(65) Prior Publication Data
US 2011/0315194 A1    Dec. 29, 2011

(30) Foreign Application Priority Data
Jun. 25, 2010    (CN) .......................... 2010 1 0209902

(51) Int. Cl.
*H01L 35/00* (2006.01)
*H01L 35/32* (2006.01)

(52) U.S. Cl.
CPC ............. *H01L 35/32* (2013.01); *Y10S 977/742* (2013.01)
USPC .......................................... 136/206; 977/742

(58) Field of Classification Search
CPC ...................................................... H01L 35/32
USPC .......................................................... 136/206
See application file for complete search history.

(56) References Cited

U.S. PATENT DOCUMENTS

| | | | | |
|---|---|---|---|---|
| 4,251,291 A | * | 2/1981 | Gomez | 136/206 |
| 2008/0017236 A1 | * | 1/2008 | Perlo et al. | 136/201 |
| 2009/0044848 A1 | * | 2/2009 | Lashmore et al. | 136/201 |
| 2009/0260667 A1 | * | 10/2009 | Chen et al. | 136/201 |

* cited by examiner

*Primary Examiner* — Allison Bourke
(74) *Attorney, Agent, or Firm* — Novak Druce Connolly Bove + Quigg LLP

(57) ABSTRACT

A photoelectric cell includes at least one photoelectric conversion module. The photoelectric module includes a first photoelectric conversion element and a second photoelectric conversion element. The first photoelectric conversion element is made of a first thermoelectric material having positive thermoelectric coefficient and comprises a first absorbing part and a first non-absorbing part. The second photoelectric conversion element is made of a second thermoelectric material having negative thermoelectric coefficient and comprises a second absorbing part and a second non-absorbing part. The first absorbing part is electrically connected with the second absorbing part.

13 Claims, 6 Drawing Sheets

SOLAR THERMOELECTRIC CELL WITH COVERING STRUCTURE TO PROVIDE THERMAL GRADIENT

RELATED APPLICATIONS

This application claims all benefits accruing under 35 U.S.C. §119 from China Patent Application No. 201010209902.8, filed on Jun. 25, 2010 in the China Intellectual Property Office, the contents of which are hereby incorporated by reference. The application is also related to copending application entitled, "INFRARED DETECTOR," filed Sep. 7, 2010 Ser. No. 12/876,352.

BACKGROUND

1. Technical Field

The present disclosure generally relates to photoelectric cells.

2. Description of Related Art

Electrical energy is essential for human development in today's society. Light energy, especially solar energy, is widely used to generate electricity because the raw material is abundant and environmentally friendly.

Solar cell is one type of device for converting light energy to electricity. A solar cell (also referred to as a photovoltaic cell) may be provided using a semiconductor material such as Si, GaAs, AlGaAs, GaInP, and/or AlInP. When light (such as solar radiation) passes through the semiconductor material of a solar cell, an electrical current and/or voltage is generated. However, an area for capturing solar energy may require an equal area of exposed electronic grade semiconductor material, such as single crystal silicon, which may be relatively expensive to manufacture. As such, the solar cell is expensive which may limit the application of the solar cell.

What is needed, therefore, is a photoelectric cell based on carbon nanotubes that can overcome the above-described shortcomings.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
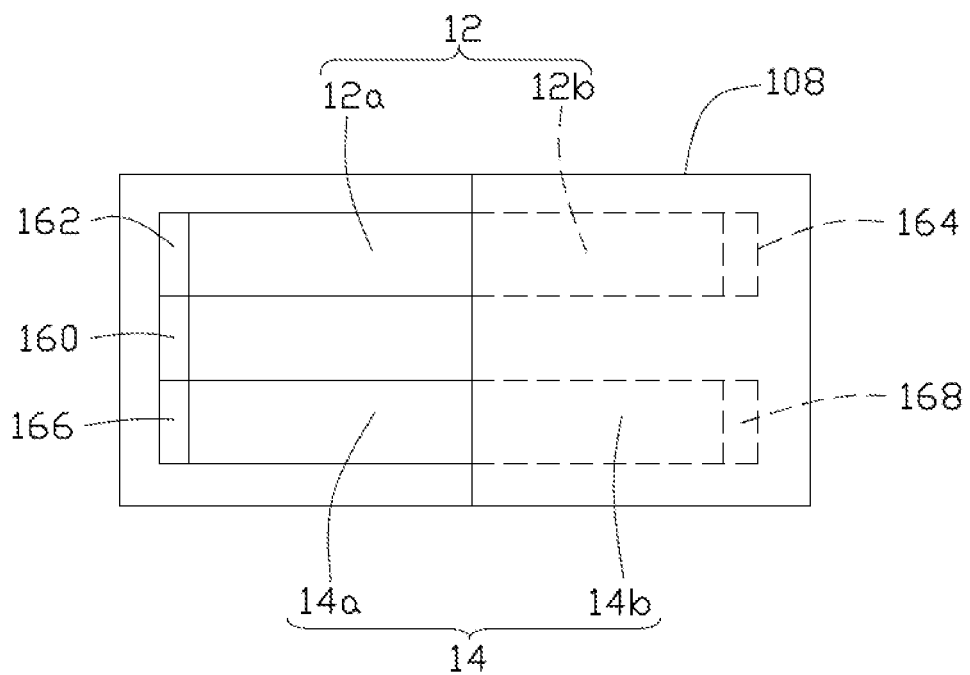
FIG. 1 is a schematic view of one embodiment of a photoelectric cell.

Referring to FIG. 1, a photoelectric cell 10 of one embodiment is shown. The photoelectric cell 10 includes a photoelectric conversion module 100, a substrate 110 and a cover structure 108. The photoelectric conversion module 100 is disposed on the substrate 110. The photoelectric conversion module 100 includes a first photoelectric conversion element 12, a second photoelectric conversion element 14, a first electrode 162, a second electrode 164, a third electrode 166, and a fourth electrode 168. The first electrode 162 and the second electrode 164 are disposed on two opposite ends of the first photoelectric conversion element 12 and are electrically connected with the first photoelectric conversion element 12. The third electrode 166 and the fourth electrode 168 are disposed on opposite ends of the second photoelectric conversion element 14 and are electrically connected with the second photoelectric conversion element 14. The first photoelectric conversion element 12 includes a first absorbing part 12a and a first non-absorbing part 12b. The second photoelectric conversion element 14 includes a second absorbing part 14a and a second non-absorbing part 14b. The first absorbing part 12a is electrically connected with the second absorbing part 14a. The covering structure 108 covers the first non-absorbing part 12b and the second non-absorbing part 14b.

The substrate 110 is used to support the first photoelectric conversion element 12 and the second photoelectric conversion element 14. If the first photoelectric conversion element 12 and the second photoelectric conversion element 14 are both free-standing, the substrate 110 can be omitted. A material of the substrate 110 can be dielectric materials, such as glass, ceramic, polymer, or wood. The substrate 110 can also be made of conductive materials coated with dielectric materials. In one embodiment, the substrate 110 should not absorb infrared or very little light energy. A thickness of the substrate 110 can be in a range from about 1 millimeter to about 2 centimeters. In one embodiment according to FIG. 1, the substrate 110 is a square ceramic sheet of about 5 millimeters thick.

The first absorbing part 12a is used to absorb light energy irradiating on the photoelectric cell 10. The first non-absorbing part 12b should not absorb the light energy. A temperature of the first absorbing part 12a would increase after absorbing the light energy, and then a temperature difference would exist between the first absorbing part 12a and the first non-absorbing part 12b. The first photoelectric conversion element 12 can be made of a first thermoelectric material having a positive thermoelectric coefficient. The first thermoelectric material can be a P-type semiconductor.

The second absorbing part 14a is used to absorb light energy irradiating on the photoelectric cell 10. The second non-absorbing part 14b cannot absorb the light energy. A temperature of the second absorbing part 14a would increase after absorbing the light energy, and then a temperature difference would exist between the second absorbing part 14a and the second non-absorbing part 14b. The second photoelectric conversion element 14 can be made of a second thermoelectric material having a negative thermoelectric coefficient. The second thermoelectric material can be an N-type semiconductor.

The working principle of the photoelectric cell 10 is based on the thermoelectric effect. The thermoelectric effect occurs when a temperature difference exists at two ends of a thermoelectric material, thereby producing an electric potential difference at the two ends. The two ends of the thermoelectric material can be called a higher temperature end and a lower temperature end. If the electric potential difference between the higher temperature end and the lower temperature of the thermoelectric material is positive, the thermoelectric material has a positive thermoelectric coefficient. If the electric potential difference between the higher temperature end and the lower temperature of the thermoelectric material is negative, the thermoelectric material has a negative thermoelectric coefficient. When light energy irradiates on the photoelectric cell 10, the first absorbing part 12a of the first photoelectric conversion element 12 and the second absorbing part 14a will absorb the light energy. Because of the temperature difference between the first absorbing part 12a and the first non-absorbing part 12b, a first electric potential difference is produced between the first absorbing part 12a and the first non-absorbing part 12b. Because of the temperature difference between the second absorbing part 14a and the second non-absorbing part 14b, a second electric potential difference is produced between the second absorbing part 14a and the second non-absorbing part 14b. Because the first photoelectric conversion element 12 is made of a first thermoelectric material having a positive thermoelectric coefficient and the second photoelectric conversion element 14 is made of a second material having a negative thermoelectric coefficient, the first electric potential difference and the second electric potential difference are reverse. Because the first absorbing part 12a and the second absorbing part 14a are electrically connected with each other, a voltage between the first electrode 162 and the fourth electrode 168 is a sum of the first electric potential difference and the second electric potential difference. A material of the first photoelectric conversion element 12 and the second photoelectric conversion element 14 can strongly absorb light and convert it into heat, has a large thermoelectric coefficient, and has specific heat capacity.

The first photoelectric conversion element 12 can have a planar structure. The planar structure can be a porous planar structure, such as a net structure. The first photoelectric conversion element 12 can be a carbon nanotube layer. The carbon nanotube layer can be planar or have a camber. The carbon nanotube layer can be a free standing structure, that is, the carbon nanotube layer can be supported by itself without a substrate. For example, if at least one point of the carbon nanotube layer is held, the entire carbon nanotube layer can be lifted without being destroyed. The carbon nanotube layer includes a number of carbon nanotubes disposed uniformly and joined by Van der Waals attractive force therebetween. The carbon nanotubes can be single-walled carbon nanotubes, double-walled carbon nanotubes, multi-walled carbon nanotubes, or combinations thereof. In some embodiments, the carbon nanotubes are single-walled carbon nanotubes. The carbon nanotube layer can be a substantially pure structure of the carbon nanotubes, with few impurities. The carbon nanotubes can be used to form many different structures and provide a large specific surface area. The heat capacity per unit area of the carbon nanotube layer can be less than $2 \times 10^{-4}$ J/m$^2$*K. In one embodiment, the heat capacity per unit area of the carbon nanotube layer is less than or equal to $1.7 \times 10^{-6}$ J/m$^2$*K.

The carbon nanotubes in the carbon nanotube layer can be orderly or disorderly arranged. The term 'disordered carbon nanotube layer' refers to a structure in which the carbon nanotubes are arranged along different directions, and the aligning directions of the carbon nanotubes are random. The number of the carbon nanotubes arranged along each different direction can be almost the same (e.g. uniformly disordered). The disordered carbon nanotube layer can be isotropic, namely the carbon nanotube layer has properties identical in all directions of the carbon nanotube layer. The carbon nanotubes in the disordered carbon nanotube layer can be entangled with each other.

The term 'ordered carbon nanotube layer' refers to a structure in which the carbon nanotubes are arranged in a consistently systematic manner, e.g., the carbon nanotubes are arranged approximately along a same direction and/or have two or more sections within each of which the carbon nanotubes are arranged approximately along a same direction (different sections can have different directions). The carbon nanotubes in the carbon nanotube layer can be selected from single-walled, double-walled, and/or multi-walled carbon nanotubes. In one embodiment, the carbon nanotube layer is a pure structure of single-walled carbon nanotubes.

The carbon nanotube layer can be a film structure with a thickness ranging from about 100 nanometers (nm) to about 5 mm. The carbon nanotube layer can include at least one carbon nanotube film.

In one embodiment, the carbon nanotube film is a drawn carbon nanotube film. A film can be drawn from a carbon nanotube array, to obtain a drawn carbon nanotube film. The drawn carbon nanotube film includes a number of successive and oriented carbon nanotubes joined end-to-end by Van der Waals attractive force therebetween. The drawn carbon nanotube film is a free-standing film. Each drawn carbon nanotube film includes a number of successively oriented carbon nanotube segments joined end-to-end by Van der Waals attractive force therebetween. Each carbon nanotube segment includes a number of carbon nanotubes substantially parallel to each other, and joined by Van der Waals attractive force therebetween. Some variations can occur in the drawn carbon nanotube film. The carbon nanotubes in the drawn carbon nanotube film are oriented along a preferred orientation. The carbon nanotube film can be treated with an organic solvent to increase the mechanical strength and toughness of the carbon nanotube film and reduce the coefficient of friction of the carbon nanotube film. The thickness of the carbon nanotube film can range from about 0.5 nm to about 100 μm.

The carbon nanotube layer of the first photoelectric conversion element 12 can include at least two stacked carbon nanotube films. In other embodiments, the carbon nanotube layer can include two or more coplanar carbon nanotube films, and can include layers of coplanar carbon nanotube films. Additionally, when the carbon nanotubes in the carbon nanotube film are aligned along one preferred orientation (e.g., the drawn carbon nanotube film), an angle can exist between the orientations of carbon nanotubes in adjacent films, whether stacked or adjacent. Adjacent carbon nanotube films can be joined by only the Van der Waals attractive force therebetween. The number of the layers of the carbon nanotube films is not limited. However, the thicker the carbon nanotube layer, the specific surface area will decrease. An angle between the aligned directions of the carbon nanotubes in two adjacent carbon nanotube films can range from about 0 degrees to about 90 degrees. If the angle between the aligned directions of the carbon nanotubes in adjacent carbon nanotube films is larger than 0 degrees, the carbon nanotubes in the first photoelectric conversion element 12 define a microporous structure. The carbon nanotube layer in an embodiment employing these films will have a number of micropores. Stacking the carbon nanotube films will also add to the structural integrity of the carbon nanotube layer.

In other embodiments, the carbon nanotube film can be a flocculated carbon nanotube film. The flocculated carbon nanotube film can include a number of long, curved, disordered carbon nanotubes entangled with each other. Furthermore, the flocculated carbon nanotube film can be isotropic.

The carbon nanotubes can be substantially uniformly dispersed in the carbon nanotube film. Adjacent carbon nanotubes are acted upon by Van der Waals attractive force to obtain an entangled structure with micropores defined therein. It is noteworthy that the flocculated carbon nanotube film is very porous. Sizes of the micropores can be less than 10 μm. The porous nature of the flocculated carbon nanotube film will increase the specific surface area of the carbon nanotube layer. Further, due to the carbon nanotubes in the carbon nanotube layer being entangled with each other, the carbon nanotube layer employing the flocculated carbon nanotube film has excellent durability, and can be fashioned into desired shapes with a low risk to the integrity of the carbon nanotube layer. The thickness of the flocculated carbon nanotube film can range from about 0.5 nm to about 1 mm.

In other embodiments, the carbon nanotube film can be a pressed carbon nanotube film. The pressed carbon nanotube film can be a free-standing carbon nanotube film. The carbon nanotubes in the pressed carbon nanotube film are arranged along a same direction or along different directions. The carbon nanotubes in the pressed carbon nanotube film can rest upon each other. Adjacent carbon nanotubes are attracted to each other and are joined by Van der Waals attractive force. An angle between a primary alignment direction of the carbon nanotubes and a surface of the pressed carbon nanotube film is about 0 degrees to approximately 15 degrees. The greater the pressure applied, the smaller the angle obtained. If the carbon nanotubes in the pressed carbon nanotube film are arranged along different directions, the carbon nanotube layer can be isotropic, meaning that the carbon nanotube film has properties identical in all directions substantially parallel to a surface of the carbon nanotube film. The thickness of the pressed carbon nanotube film ranges from about 0.5 nm to about 1 mm.

Because the heat capacity of the carbon nanotube layer is very low, the temperature of the first photoelectric conversion element 12 can rise and fall quickly, and has a high response heating speed. Further, because the carbon nanotube has a large specific surface area, the carbon nanotube layer with a number of carbon nanotubes has a larger specific surface area, and the carbon nanotube layer has high absorbing efficiency of light.

The material of the second photoelectric conversion element 14 can be selected from N-typed silicon, N-typed bismuth tellurium (Bi2Te3), N-typed bismuth, and N-typed carbon nanotube composite layer. The carbon nanotube composite layer can be formed by polymerizing the carbon nanotube layer disclosed above and amine-rich polymers. The amine-rich polymers can functionalize the carbon nanotube layer to switch from P-type to N-type. The amine-rich polymers are coated on a surface of the carbon nanotube layer or are immersed in the carbon nanotube layer. The amine-rich polymers can be polymer ethanediamine or polyethyleneimine (PEI).

The first electrode 162 and the second electrode 164 can be separately disposed on two opposite ends of the first photoelectric conversion element 12. The first electrode 162 is disposed on the first absorbing part 12a, and the second electrode 164 is disposed on the first non-absorbing part 12b. The third electrode 166 and the fourth electrode 168 can be separately disposed on two opposite ends of the second photoelectric conversion element 14. The third electrode 166 is disposed on the second absorbing part 14a, and the fourth electrode 168 is disposed on the second non-absorbing part 14b. The first electrode 162, the second electrode 164, the third electrode 166, and the fourth electrode 168 are made of conductive material. The shapes of the first, second, third, and fourth electrodes 162, 164, 166, and 168 can be wire-shaped or bar-shaped. The cross sectional shape of first, second, third and fourth electrodes 162, 164, 166, and 168 can be round, square, trapezium, triangular, or polygonal. The thickness of the first, second, third and fourth electrodes 162, 164, 166, and 168 can be about 1 micrometer to about 5 millimeters or any size, depending on the design. A material of the first, second, third, and fourth electrodes can be metal, conductive polymer, or ITO. In one embodiment, according to FIG. 1, the first electrode 162 and the second electrode 164 are disposed on a surface of the first photoelectric conversion element 12. The first electrode 162 is disposed on one side. The second electrode 164 is disposed on another side opposite to the side where the first electrode 162 is disposed. The third electrode 166 and the fourth electrode 168 are disposed on a surface of the second photoelectric conversion element 14. The third electrode 166 is disposed on one side. The fourth electrode 168 is disposed on another side opposite the side wherein the third electrode 166 is disposed. The first electrode 162 and the third electrode 166 are electrically connected with each other via a conductive sheet 160. The second electrode 164 and the fourth electrode 168 are both voltage output ends.

The covering structure 108 is configured to cover the first non-absorbing part 12b and the second non-absorbing part 14b, thus, the first non-absorbing part 12b and the second non-absorbing part 14b cannot absorb infrared. The material of the covering structure 108 can be conductive or insulative. The electrically conductive material can be metal or alloy. The metal can be copper, aluminum, or titanium. The insulated material can be resin, ceramic, plastic, or wood. The thickness of the covering structure 108 can range from about 0.5 μm to about 2 mm. If the material of the covering structure 108 is insulative, the covering structure 108 can be directly disposed on a surface of the first photoelectric conversion element 12 and the second photoelectric conversion element 14. If the covering structure 108 is conductive, the covering structure 108 should be insulated with the first photoelectric conversion element 12 and the second photoelectric conversion element 14. The covering structure 108 can be disposed above the first photoelectric conversion element 12 and the second photoelectric conversion element 14 and apart from the first photoelectric conversion element 12 and the second photoelectric conversion element 14.

The photoelectric cell 10 can further include a first lead wire (not shown) and a second lead wire (not shown). The first lead wire is electrically connected with the first electrode 162. The second lead wire is electrically connected with the fourth electrode 168. The first lead wire can facilitate the first electrode 162 to electrically connect without a circuit, and the second lead wire can facilitate the fourth electrode 168 to electrically connect without a circuit.

The first absorbing part 12a and the first non-absorbing part 12b are two different parts of the first photoelectric conversion element 12 divided by the covering structure 108. The second absorbing part 14a and the second non-absorbing part 14b are two different parts of the second photoelectric conversion element 14 divided by the covering structure 108. In operation, the photoelectric cell 10, the first absorbing part 12a, and the second absorbing part 14a absorb light energy, the first non-absorbing part 12b and the second non-absorbing part 14b are insulated from the light. An area ratio between the first absorbing part 12a and the first non-absorbing part 12b can be in a range from about 1:2 to about 2:1. An area ratio between the second absorbing part 14a and the second non-absorbing part 14b can be in a range from about 1:2 to about 2:1. In one embodiment, the area ratio between the first absorbing part 12a and the first non-absorbing part 12b is about 3:2, and the area ratio between the second absorbing part 14a and the second non-absorbing part 14b is about 3:2.

The photoelectric cell 10 disclosed above has numerous advantages. First, the photoelectric cell 10 changes the light energy into electricity based on the thermoelectric effect, the structure of the photoelectric cell 10 is simple, and the material for making the first photoelectric conversion element 12 and second photoelectric conversion element 14 is inexpensive, therefore, the photoelectric cell 10 has a low cost. Second, the first photoelectric conversion element 12 includes a carbon nanotube layer, the carbon nanotube is an ideal black body, and the first photoelectric conversion element 12 has a high energy absorbing efficiency of energy, therefore, the photoelectric cell 10 has high energy absorbing efficiency. Third, the carbon nanotube layer, especially a carbon nanotube layer having a pure structure of single-walled carbon nanotubes, has a high thermoelectric conversion efficiency, and the first photoelectric conversion element 12 has high light-electricity conversion efficiency.

Figure 2:
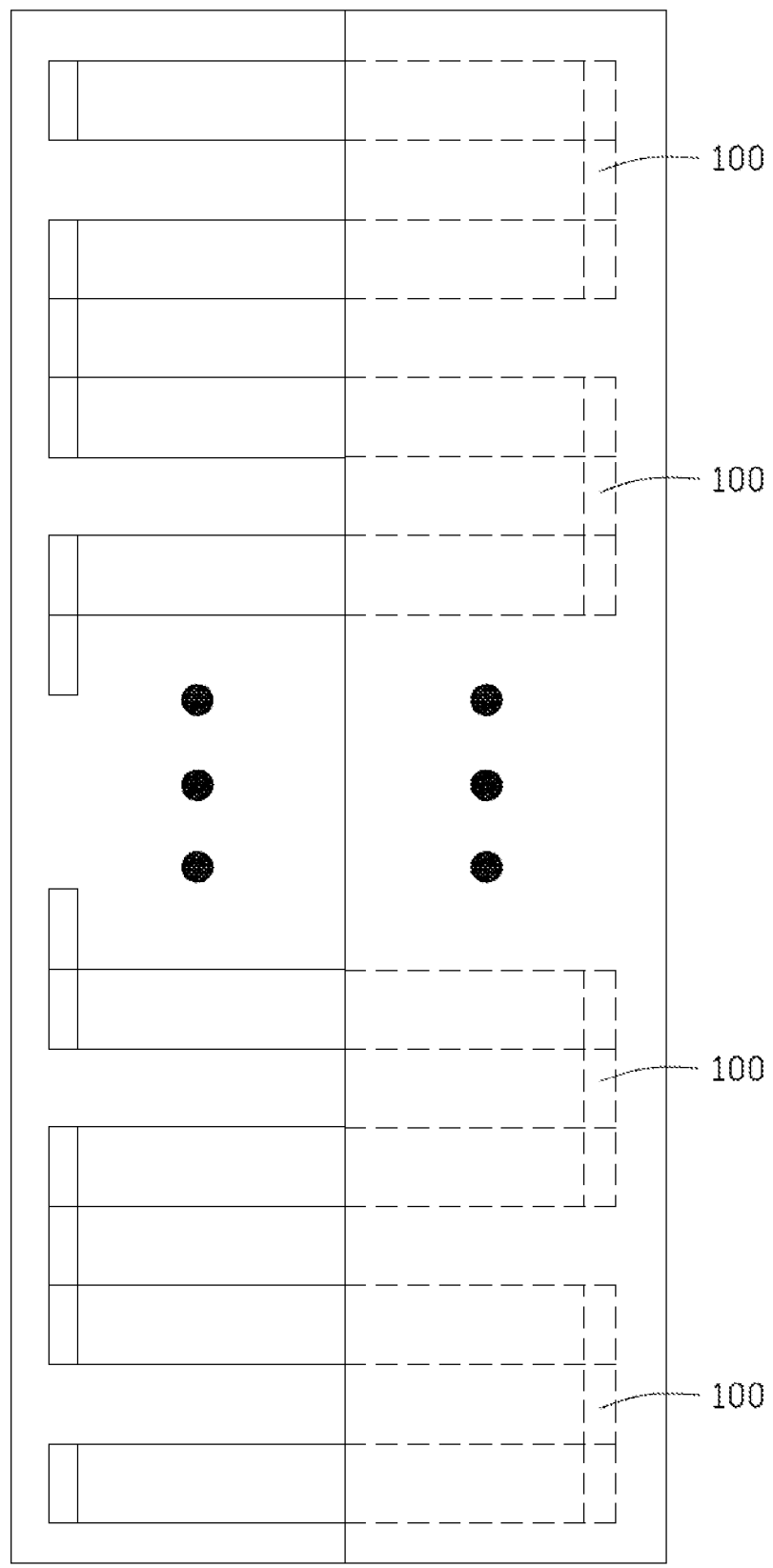
FIG. 2 is a schematic view of another embodiment of a photoelectric cell.

Referring to FIG. 2, a photoelectric cell 20 of one embodiment is shown. The photoelectric cell 20 includes a number of photoelectric conversion modules 100, a substrate (not labeled), and a covering structure (not shown).

Each of the number of photoelectric conversion modules 100 is the same as the photoelectric conversion module 100 disclosed above. The number of photoelectric conversion modules 100 is serially electrically connected with each other. In each adjacent photoelectric conversion module, the second non-absorbing part of one photoelectric conversion module is electrically connected with the first non-absorbing part of another photoelectric conversion module. In one embodiment according to FIG. 2, in each adjacent photoelectric conversion module 100, the fourth electrode (not shown) of one photoelectric conversion module 100 is electrically connected with the first electrode (not shown) of another photoelectric conversion module 100. In the two photoelectric conversion modules 100 that are separately disposed on two ends, the first electrode of one photoelectric conversion module 100 and the fourth electrode of another photoelectric conversion module 100 are the two voltage output electrodes.

Figure 3:
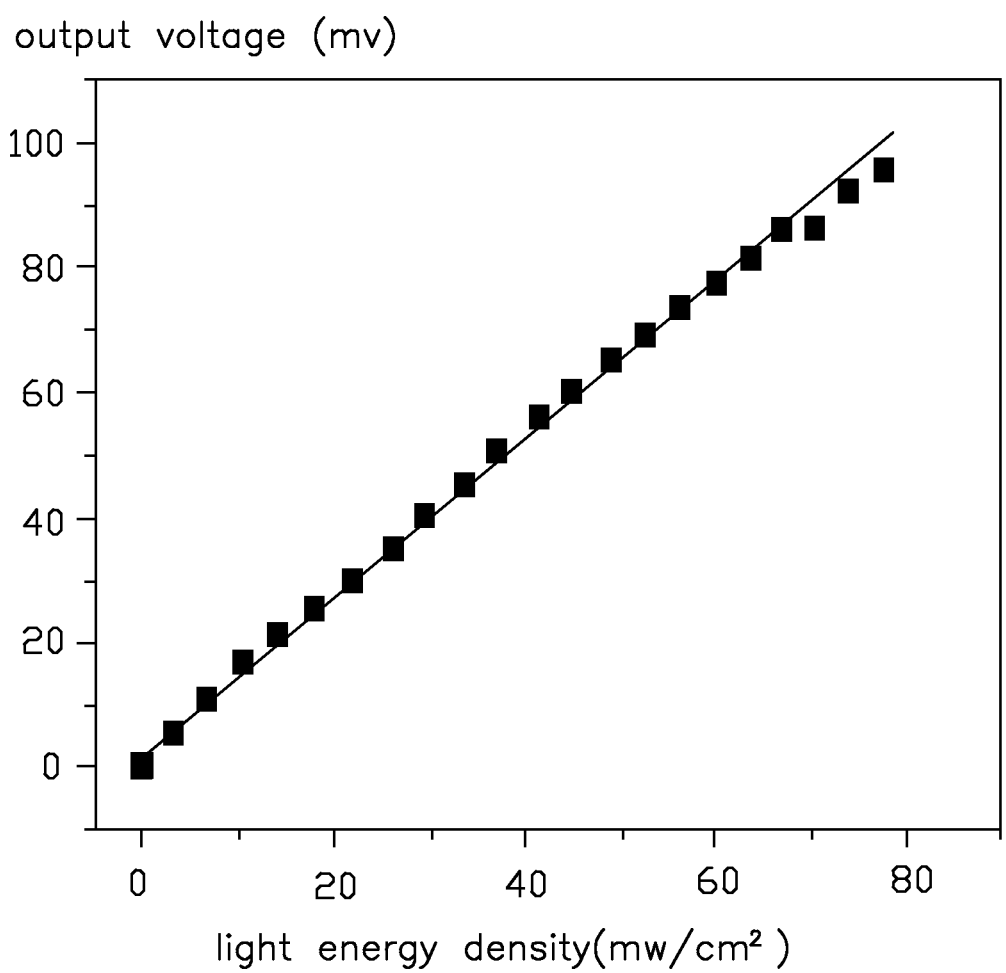
FIG. 3 is a relationship chart between strength of illumination and an output voltage of the photoelectric cell of FIG. 2.

FIG. 3 shows the relationship between light energy density and an output voltage of the photoelectric cell 20, which includes 12 photoelectric conversion modules 100 serially electrically connect with each other. In the photoelectric cell 20, a larger voltage can be produced by serially electrically connecting the photoelectric conversion modules 100.

Other characteristics of the photoelectric cell 20 are the same as the photoelectric cell 10 disclosed above.

Figure 4:
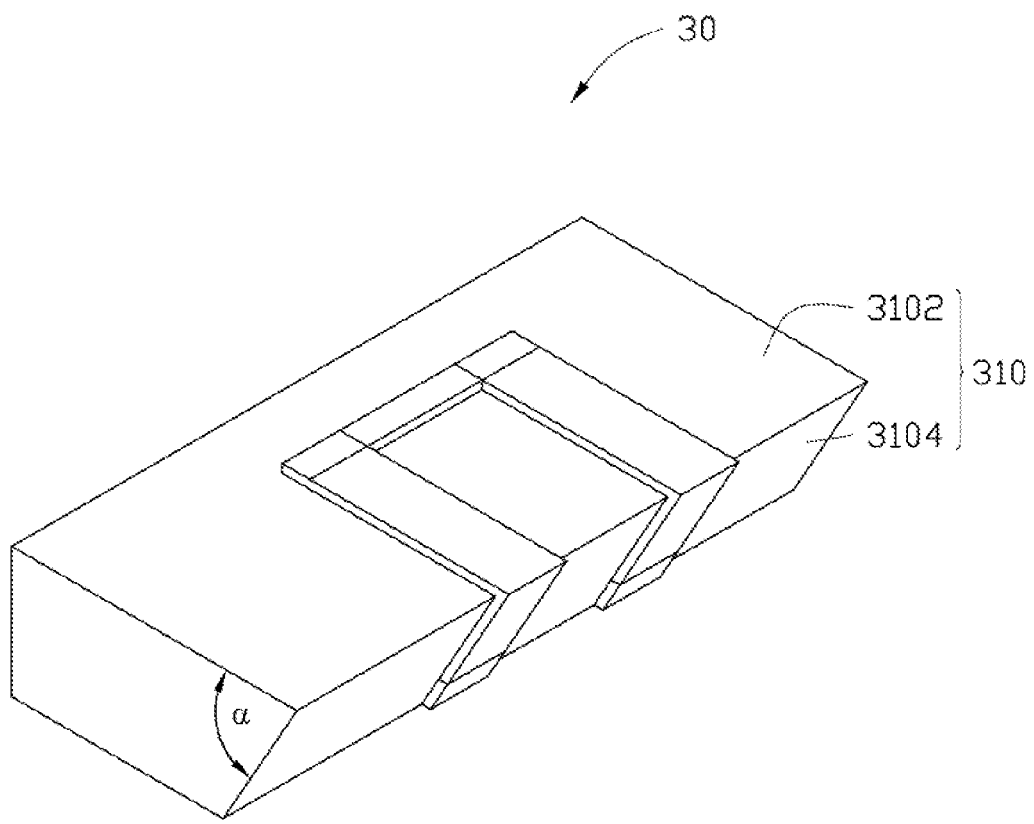
FIG. 4 is a schematic view of yet another embodiment of a photoelectric cell.

Referring to FIG. 4, a photoelectric cell 30 according to yet another embodiment is provided. The photoelectric cell 30 includes the photoelectric conversion module 100 disclosed above and an insulated structure 310. The photoelectric conversion module 100 is disposed on a surface of the insulated structure 310.

The insulated structure 310 includes a first surface 3102 and a second surface 3104. In one embodiment, the first surface 3102 and the second surface 3104 can be adjacent, and an angle α between the first surface 3102 and the second surface 3104 is less than 90 degrees. In another embodiment, the first surface 3102 and the second surface 3104 can be two opposite surfaces of the insulated structure 310. The first absorbing part 12a and the second absorbing part 14a are disposed on the first surface 3102. The first non-absorbing part 12b and the second non-absorbing part 14b are disposed on the second surface 3104. As such, the first photoelectric conversion element (not labeled) and the second photoelectric conversion element (not labeled) are curved. An angle between the first absorbing part and the first non-absorbing part is less than 90 degrees. An angle between the second absorbing part and the second non-absorbing part is less than 90 degrees. As such, when a light is irradiating on the first absorbing part and the second absorbing part, the first non-absorbing part and the second non-absorbing part cannot be irradiated by the light.

The photoelectric cell 30 can further includes a reflective layer 312 disposed between the first and second absorbing parts 12a and 14a, and the surface of the insulated structure 310. The reflective layer 312 is configured to reflect the heat of the first and second absorbing parts 12a and 14a, and light irradiating on the insulated structure 310, and causing the first and second absorbing parts to have a high absorption. A material of the reflective layer 312 can be insulative materials. The insulative materials can be metal oxides, metal salts, or ceramics. The reflective layer 312 can also be IR-reflective material, such as $TiO_2$—Ag—$TiO_2$, ZnS—Ag—ZnS, AlNO—Ag-AlN, $Ta_2O_3$—SiO, or $Nb_2O_3$—$SiO_2$. A thickness of the reflective layer can be in a range from about 20 micrometers to about 500 micrometers.

Other characteristics of the photoelectric cell 30 are the same as the photoelectric cell 10 disclosed above.

Figure 5:
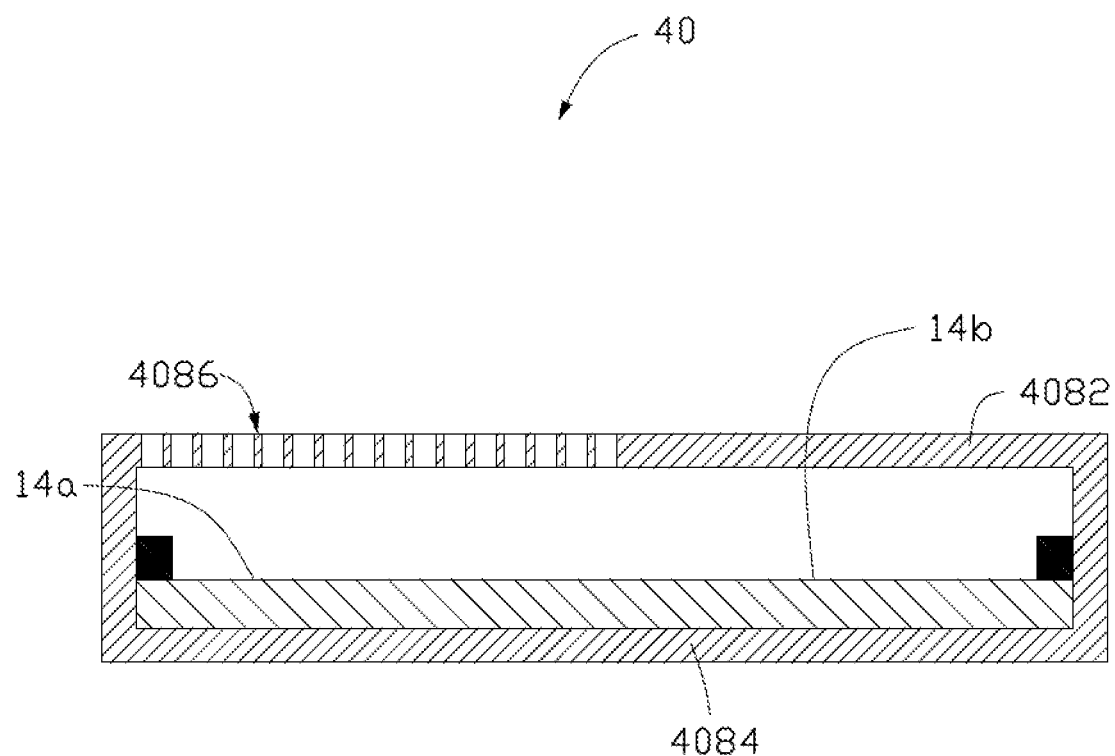
FIG. 5 is a schematic view of still another embodiment of a photoelectric cell.
Figure 6:
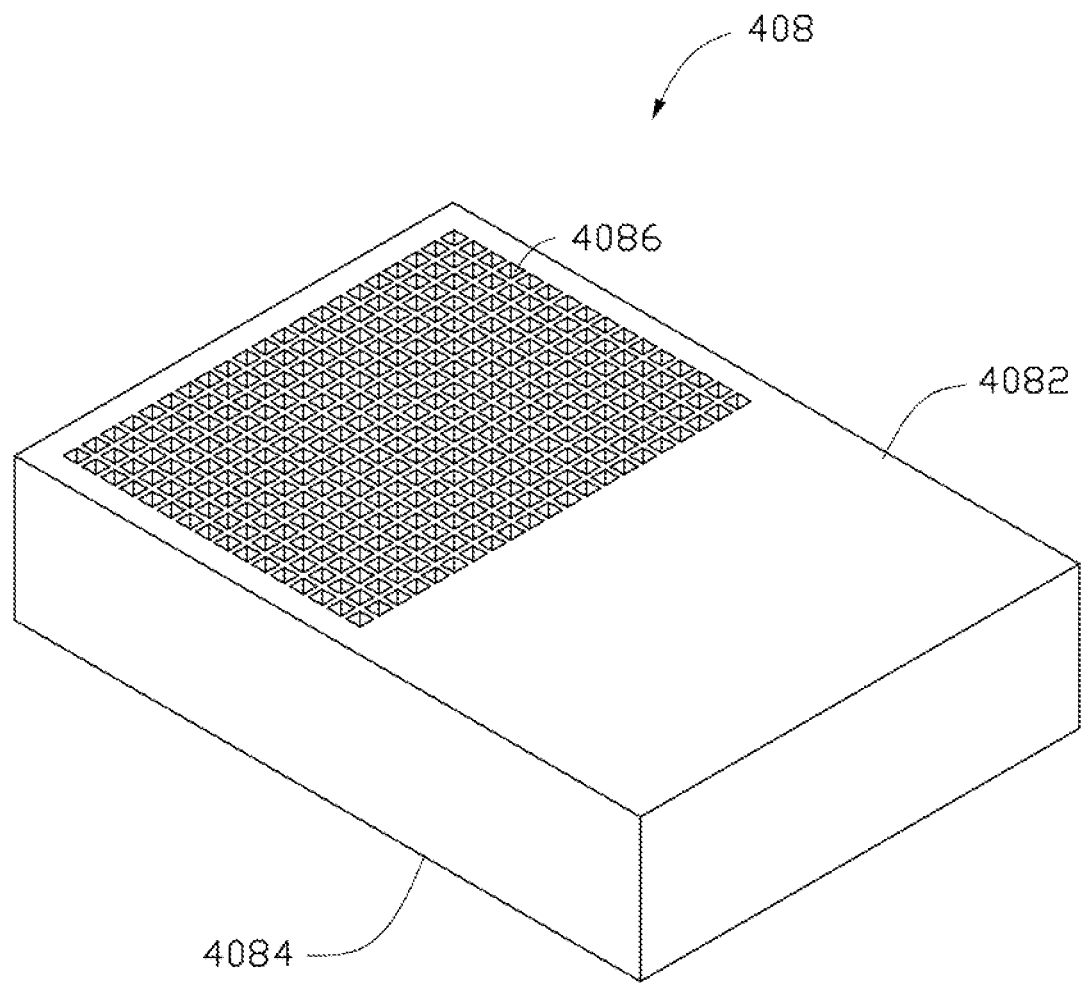
FIG. 6 is a schematic view of the covering structure of the photoelectric cell in FIG. 5.

Referring to FIGS. 5 and 6, a photoelectric cell 40 according to still another embodiment is provided. The photoelectric cell 40 includes the photoelectric conversion module 100 disclosed above and a covering structure 408.

The covering structure 408 is an enclosure defining a hollow space, with the photoelectric conversion module 100 disposed in the covering structure 408. The covering structure 408 includes a light-passing region 4086. The first absorbing part (not shown) and the second absorbing part 14a face the light-passing region 4086. The light can pass through the light-passing region 4086 and irradiate on the first and second absorbing parts. The light-passing region 4086 can include a number of through holes. Alternatively, the light-passing region 4086 can be transparent. A shape of the covering structure 408 is not limited, and can be cylindrical, cubical, or spherical. In one embodiment according to FIG. 6, the covering structure 408 has a cube structure. The covering structure 408 includes an upper sheet 4082, a lower sheet 4084, and four side sheets (not labeled). The first photoelectric conversion element and the second photoelectric element are disposed on a surface of the lower sheet 4084. The light-passing region 4086 is defined by the upper sheet 4082 and includes a number of through holes. The light-passing region 4086 has a net structure.

Other characteristics of the photoelectric cell 40 are the same as the photoelectric cell 10 disclosed above.

It is to be understood that the above-described embodiments are intended to illustrate rather than limit the present disclosure. Variations may be made to the embodiments without departing from the spirit of the disclosure as claimed. It is understood that any element of any one embodiment is considered to be disclosed to be incorporated with any other embodiment. The above-described embodiments illustrate the scope of the disclosure but do not restrict the scope of the disclosure.

What claimed is:

1. A solar thermoelectric cell comprising at least one solar thermoelectric conversion module comprising:
   a first thermoelectric conversion element made of a first thermoelectric material having a positive thermoelectric coefficient extending in a first direction, and comprising a first absorbing part and a first non-absorbing part;

a second thermoelectric conversion element made of a second thermoelectric material having negative thermoelectric coefficient extending in the first direction and comprising a second absorbing part and a second non-absorbing part; and a covering structure extending in the first direction covering and above the first non-absorbing part and the second non-absorbing part in a second direction, wherein the second direction is perpendicular to the first direction, the covering structure being configured to prevent a first light from directly impinging the first non-absorbing part and the second non-absorbing part, wherein the first absorbing part and the second absorbing part are exposed from the covering structure so that the first absorbing part and the second absorbing part are configured to be directly impinged by the first light and to absorb the first light;

wherein the first absorbing part is electrically connected with the second absorbing part.

2. The solar thermoelectric cell of claim 1, further comprising a first electrode electrically connected with the first absorbing part, a second electrode electrically connected with the first non-absorbing part, a third electrode electrically connected with the second absorbing part, and a fourth electrode electrically connected with the second non-absorbing part.

3. The solar thermoelectric cell of claim 1, wherein the first thermoelectric conversion element comprises a carbon nanotube layer.

4. The solar thermoelectric cell of claim 3, wherein the carbon nanotube layer is a pure structure of single-walled carbon nanotubes.

5. The solar thermoelectric cell of claim 3, wherein a heat capacity per unit area of the carbon nanotube layer is less than or equal to about $2 \times 10^{-4}$ J/cm$^2$*K.

6. The solar thermoelectric cell of claim 1, the second thermoelectric conversion element is a carbon nanotube composite comprising a carbon nanotube layer and amine-rich polymers.

7. The solar thermoelectric cell of claim 1, wherein the second thermoelectric conversion element is an N-type semiconductor, and the first thermoelectric conversion element is a P-type semiconductor.

8. The solar thermoelectric cell of claim 1, further comprising a substrate, wherein the first thermoelectric conversion element and the second thermoelectric conversion element are disposed on the substrate, the covering structure and the substrate cooperatively define a hollow space, and the first non-absorbing part and the second non-absorbing part are disposed in the hollow space.

9. The solar thermoelectric cell of claim 1, wherein the covering structure is an enclosure defining a hollow space, and the at least one photoelectric conversion module is disposed in the covering structure, the covering structure comprises a light-passing region comprising a plurality of through holes or the light-passing region is transparent, and the first absorbing part and the second absorbing part face the light-passing region.

10. The solar thermoelectric cell of claim 3, wherein the carbon nanotube layer comprises a plurality of carbon nanotubes joined end to end and oriented in a same direction.

11. The solar thermoelectric cell of claim 6, wherein the amine-rich polymers is polymer ethanediamine or polyethyleneimine.

12. The solar thermoelectric cell of claim 1, wherein the covering structure is directly attached on the first non-absorbing part and the second non-absorbing part.

13. The solar thermoelectric cell of claim 7, wherein the first thermoelectric conversion element is spaced from the second thermoelectric conversion element.

\* \* \* \* \*